(12) United States Patent
Vorbach

(10) Patent No.: US 9,817,790 B2
(45) Date of Patent: *Nov. 14, 2017

(54) MULTI-PROCESSOR WITH SELECTIVELY INTERCONNECTED MEMORY UNITS

(71) Applicant: PACT XPP TECHNOLOGIES AG, Munich (DE)

(72) Inventor: Martin Vorbach, Lingenfeld (DE)

(73) Assignee: PACT XPP TECHNOLOGIES AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/052,730

(22) Filed: Feb. 24, 2016

(65) Prior Publication Data

US 2016/0170925 A1   Jun. 16, 2016

Related U.S. Application Data

(63) Continuation of application No. 14/458,099, filed on Aug. 12, 2014, now Pat. No. 9,274,984, which is a continuation of application No. 13/626,047, filed on Sep. 25, 2012, now Pat. No. 8,803,552, which is a continuation of application No. 13/040,769, filed on Mar. 4, 2011, now Pat. No. 8,310,274, which is a continuation of application No. 12/836,364, filed on Jul. 14, 2010, now Pat. No. 7,928,763, which is a continuation of application No. 12/541,299, filed on Aug. 14, 2009, now Pat. No. 7,782,087, which is a continuation of application No. 12/082,073, filed on Apr. 7, 2008, now Pat. No. 7,602,214, which is a continuation of application No. 10/526,595, filed as (Continued)

(30) Foreign Application Priority Data

| Sep. 6, 2002 | (DE) | 102 41 812 |
| Apr. 4, 2003 | (DE) | 103 15 295 |
| May 15, 2003 | (DE) | 103 21 834 |
| Aug. 28, 2003 | (EP) | 03019428 |

(51) Int. Cl.
| *H03K 19/173* | (2006.01) |
| *G06F 15/78* | (2006.01) |
| *G06F 13/16* | (2006.01) |
| *G06F 9/30* | (2006.01) |
| *G06F 13/36* | (2006.01) |
| *G06F 13/40* | (2006.01) |

(52) U.S. Cl.
CPC ...... *G06F 15/7867* (2013.01); *G06F 9/30145* (2013.01); *G06F 13/16* (2013.01); *G06F 13/36* (2013.01); *G06F 13/4068* (2013.01); *H03K 19/173* (2013.01)

(58) Field of Classification Search
CPC .... G06F 13/16; G06F 15/7867; H03K 19/173
USPC ........................................................ 326/38, 41
See application file for complete search history.

(56) References Cited

U.S. PATENT DOCUMENTS

| 5,305,446 A | * | 4/1994 | Leach | G06F 9/3016 712/34 |
| 5,822,779 A | * | 10/1998 | Intrater | G06F 15/786 710/107 |

(Continued)

*Primary Examiner* — Don Le
(74) *Attorney, Agent, or Firm* — Edward P Heller III

(57) ABSTRACT

A multi-processor having a plurality of data processing units and memory units has a bus system that selectively interconnects the processing units and the memory units.

7 Claims, 6 Drawing Sheets

Related U.S. Application Data application No. PCT/EP03/09957 on Sep. 8, 2003, now Pat. No. 7,394,284.

(56) References Cited

U.S. PATENT DOCUMENTS

| | | | |
|---|---|---|---|
| 5,915,123 A * | 6/1999 | Mirsky | G06F 9/3885 326/37 |
| 6,218,876 B1 * | 4/2001 | Sung | G06F 1/04 326/93 |
| 6,362,650 B1 * | 3/2002 | New | G06F 15/7867 326/41 |
| 6,522,167 B1 * | 2/2003 | Ansari | G06F 15/7867 326/39 |
| 2003/0102889 A1 * | 6/2003 | Master | G06F 15/7867 326/41 |
| 2004/0030859 A1 * | 2/2004 | Doerr | G06F 15/8023 712/15 |
| 2004/0078548 A1 * | 4/2004 | Claydon | G06F 15/8023 712/1 |

\* cited by examiner

MULTI-PROCESSOR WITH SELECTIVELY INTERCONNECTED MEMORY UNITS

CROSS-REFERENCE TO RELATED APPLICATIONS

This application is a continuation of U.S. patent application Ser. No. 14/458,099, filed Aug. 12, 2014, which is a continuation of U.S. patent application Ser. No. 13/626,047, filed Sep. 25, 2012, now U.S. Pat. No. 8,803,552, which is a continuation of U.S. patent application Ser. No. 13/040,769, filed Mar. 4, 2011, now U.S. Pat. No. 8,310,274, which is a continuation of U.S. patent application Ser. No. 12/836,364, filed Jul. 14, 2010, now U.S. Pat. No. 7,928,763, which is a continuation of U.S. patent application Ser. No. 12/541,299, filed on Aug. 14, 2009, now U.S. Pat. No. 7,782,087, which is a continuation of U.S. patent application Ser. No. 12/082,073, filed on Apr. 7, 2008, now U.S. Pat. No. 7,602,214, which is a continuation of U.S. patent application Ser. No. 10/526,595, filed on Jan. 9, 2006, now U.S. Pat. No. 7,394,284, which is the National Stage of International Patent Application Serial No. PCT/EP03/09957, filed on Sep. 8, 2003, which claims benefit of and priority to German Patent Application Serial No. DE 102 41 812.8, filed on Sep. 6, 2002, the entire contents of each of which are expressly incorporated herein by reference thereto.

DECSRIPTION

The present invention relates to a cell element field and a method for operating same. The present invention thus relates in particular to reconfigurable data processing architectures.

The term reconfigurable architecture is understood to refer to units (VPUs) having a plurality of elements whose function and/or interconnection is variable during run time. These elements may include arithmetic logic units, FPGA areas, input/output cells, memory cells, analog modules, etc. Units of this type are known by the term VPU, for example. These typically include arithmetic and/or logic and/or analog and/or memory and/or interconnecting modules and/or communicative peripheral modules (IOs), typically referred to as PAEs, which are arranged in one or more dimensions and are linked together directly or by one or more bus systems. PAEs are arranged in any configuration, mixture and hierarchy, the system being known as a PAE array or, for short, a PA. A configuring unit may be assigned to the PAE. In addition to VPU units, in principle systolic arrays, neural networks, multiprocessor systems, processors having multiple arithmetic units and/or logic cells, interconnection and network modules such as crossbar circuits, etc., as well as FPGAs, DPGAs, transputers, etc., are also known It should be pointed out that essential aspects of VPU technology are described in the following protective rights of the same applicant as well as in the particular follow-up applications to the protective rights listed here:

P 44 16 881.0-53, DE 197 81 412.3, DE 197 81 483.2, DE 196 54 846.2-53, DE 196 54 593.5-53, DE 197 04 044.6-53, DE 198 80 129.7, DE 198 61 088.2-53, DE 199 80 312.9, PCT/DE 00/01869, DE 100 36 627.9-33, DE 100 28 397.7, DE 101 10 530.4, DE 101 11 014.6, PCT/EP 00/10516, EP 01 102 674.7, DE 102 06 856.9, 60/317,876, DE 102 02 044.2, DE 101 29 237.6-53, DE 101 39 170.6.

It should be pointed out that the documents listed above are incorporated in particular with regard to particulars and details of the interconnection, configuration, embodiment of architecture elements, trigger methods, etc., for disclosure purposes.

The architecture has considerable advantages in comparison with traditional processor architectures inasmuch as data processing is performed in a manner having a large proportion of parallel and/or vectorial data processing steps. However, the advantages of this architecture in comparison with other processor units, coprocessor units or data processing units in general are not as great when the advantages of interconnection and of the given processor architectonic particulars are no longer achievable to the full extent.

This is the case in particular when data processing steps that are traditionally best mappable on sequencer structures are to be executed. It is desirable to design and use the reconfigurable architecture in such a way that even those data processing steps which are typically particularly suitable for being executed using sequencers are executable particularly rapidly and efficiently.

The object of the present invention is to provide a novel device and a novel method for commercial application.

The method of achieving this object is claimed independently. Preferred embodiments are characterized in the subclaims.

According to a first essential aspect of the present invention, in the case of a cell element field whose function and/or interconnection is reconfigurable in particular during run time without interfering with unreconfigured elements for data processing with coarsely granular function cell elements in particular for execution of algebraic and/or logic functions and memory cell means for receiving, storing and/or outputting information, it is proposed that function cell-memory cell combinations be formed in which a control connection to the memory means is managed by the function cell means. This control connection is for making the address and/or data input/output from the memory controllable through the particular function cell, typically an ALU-PAE, It is thus possible to indicate, for example, whether the next item of information transmitted is to be handled as an address or as data and whether read and/or write access is necessary. This transfer of data from the memory cell, i.e., the memory cell means, which may be a RAM-PAE, for example, to the function cell means, which may be an ALU-PAE, for example, then makes it possible for new commands that are to be executed by the ALU to be loadable into the latter. It should be pointed out that function cell means and memory cell means may be combined by integration into a structural unit. In such a case it is possible to use a single bus connection to input data into the memory cell means and/or the ALU. Suitable input registers and/or output registers may then be provided and, if desired, additional data registers and/or configuration registers different from the former may also be provided as memory cell means.

It should also be pointed out that it is possible to construct a cell element field containing a plurality of different cells and/or cell groups, strips or similar regular patterns being preferably provided with the different cells because these permit a very regular arrangement while facilitating the design equally in terms of hardware design and operation. With such a strip-like arrangement or other regular layout of a small plurality of different cell elements, for example, elements having integrated function cell means-memory cell means combinations, i.e., cells in which function cell means and memory cell means are integrated according to the present invention, are provided centrally in the field, where typically only a few different program steps are to be executed within a sequencer structure because, as has been recognized, this provides very good results for traditional data stream applications, while more complex sequencer structures may be constructed at the edges of the field where, for example, an ALU-PAE which represents a separate unit possibly may be provided in addition to a separate RAM-PAE and optionally a number of I/O-PAEs using, i.e., arranging appropriate control lines or connections thereof because frequently more memory is needed there, e.g., to temporarily store results generated in the field central area of the cell element field and/or for datastreaming, to pre-enter and/or process data needed thereby.

When cells that integrate memory cell means and function cell means are provided, e.g., in the center of the field, a small memory may then be provided there for different commands to be executed by the function cell means such as the ALU. It is possible here in particular to separate the command memory and/or the configuration memory from a data memory, and it is possible to design the function memory to be so large that alternatively, one of several, e.g., two different sequences may be executed. The particular sequence to be executed may occur in response to results generated in the cell and/or control signals such as carry signals, overflow signals, and/or trigger signals arriving from the outside. In this way, this arrangement may also be used for wave reconfiguration methods.

In this way it is possible to construct a sequencer structure in a cell element field by providing a dedicated control connection controlled by function cells in a dedicated manner between function cell and function cell means and memory cell and/or memory cell means with only two elements connected by suitable buses without requiring additional measures and/or design changes otherwise. Data, addresses, program steps, etc., may be stored in the memory cell in a manner known per se from traditional processors. Since both elements, if properly configured, may also be used in another way, this yields a particularly efficient design which is particularly adaptable to sequencer structures as well as vectorial and/or parallelizable structures. Parallelization may thus be supported merely via suitable PAE configurations, i.e., by providing PAEs that operate in two different spatial directions and/or via cell units equipped with data throughput registers.

It is clear here that a plurality of sequencer type structures may be constructed in the reconfigurable cell element field by using only two cells in a cell element field, namely the function cell and the information processing cell. This is advantageous inasmuch as a number of different tasks that are different from one another per se must often be executed in data processing, e.g., in a multitasking-capable operating system. A plurality of such tasks must then be executed effectively and simultaneously in a single cell element field. The advantages of real time applications are obvious. Furthermore it is also possible to operate the individual sequencer structures that are constructed in a cell element field, providing the control connection according to the present invention, at different clock rates, e.g., to lower power consumption by executing lower priority tasks at a slower rate. It is also possible to execute sequencer type program parts in the field in parallel or vectorially in execution of algorithms that are largely parallel per se and vice versa.

Typically, however, it is preferable for sequencer-type structures to be clocked at a higher rate in the cell element field, whether they are sequencer-type structures having an area connected to neighboring cells or buses or whether they are combinations of spatially differentiable separate and separately useable function cell elements such as ALU-PAEs and memory cell elements such as RAM-PAEs. This has the advantage that sequential program parts, which are very difficult to parallelize in any case, may be used in a general data flow processing without any negative effect on the overall data processing. Examples of this include, e.g., a HUFFMANN coding which is executable much better sequentially than in parallel and which also plays an important role for applications such as MPEG4 coding, but in this case the essential other parts of the MPEG4 coding are also easily parallelizable. Parallel data processing is then used for most parts of an algorithm and a sequential processing block is provided therein. An increase in the clock frequency in the sequencer range by a factor of 2 to 4 is typically sufficient.

It should be pointed out that instead of a strip arrangement of different cell elements, another grouping, in particular a multidimensional grouping, may also be selected.

The cell element field having the cells whose function and/or interconnection is configurable may obviously form a processor, a coprocessor and/or a microcontroller and/or a parallel plurality of combinations thereof.

The function cells are typically formed as arithmetic logic units, which may be in particular coarsely granular elements but may also be provided with a fine granular state machine, for example. In a particularly preferred exemplary embodiment, the ALUs are extended ALUs (EALUs) as described in previous patent applications of the present applicant. An extension may include in particular the control line check, command decoder unit, etc., if necessary.

The memory cells may store data and/or information in a volatile and/or nonvolatile form. When information stored in the memory cells, whether program steps, addresses for access to data or data stored in a register-type form, i.e., a heap is stored as volatile data, a complete reconfiguration may take place during run time. Alternatively it is possible to provide nonvolatile memory cells. The nonvolatile memory cells may be provided as an EEPROM area and the like, where a rudimentary BIOS program that is to be executed on boot-up of the system is stored. This permits booting up a data processing system without additional components. A nonvolatile data memory may also be provided if it is decided for reasons of cost and/or space that the same program parts are always to be executed repeatedly, and it is also possible to alternate among such fixed program parts during operation, e.g., in the manner of a wave reconfiguration. The possibilities of providing and using such nonvolatile memories are the object of other protective rights of the present applicant. It is possible to store both volatile and nonvolatile data in the memory cells, e.g., for permanent storage of a BIOS program, and nevertheless be able to use the memory cell for other purposes.

The memory cell is preferably designed to be able to store a sufficient variety of data to be executed and/or program parts to be executed. It should be pointed out here that these program parts may be designed as program steps, each specifying what an individual PAE, in particular the assigned PAE, i.e., in particular the function cell controlling the memory cell, is to do in the next step, and they may also include entire configurations for field areas or other fields. In such a case, it is readily possible for the sequencer structure that has been created to issue a command on the basis of which cell element field areas are reconfigured. The function cell triggering this configuration then operates as a load logic at the same time. It should be pointed out that the configuration of other cells may in turn be accomplished in such a way that sequencer type data processing is performed there and it is in turn possible in these fields to configure and/or reconfigure other cells in the course of program execution. This results in an iterative configuration of cell element areas, and nesting of programs having sequencer structures and parallel structures is possible, these structures being nested one inside the other like babushka dolls. It should be pointed out that access to additional cell element fields outside of an individual integrated module is possible through input/output cells in particular, which may massively increase the total computation performance. It is possible in particular when configurations occur in a code part of a sequencer structure configured into a cell element field to perform, if necessary, the configuration requirements on an assigned cell element field which is managed only by the particular sequencer structure and/or such requirements may be issued to a configuration master unit to ensure that there is uniform occupancy of all cell element fields. This therefore results in a quasi-subprogram call by transferring the required configurations to cells or load logics. This is regarded as independently patentable. It should be pointed out that the cells, if they themselves have responsibility for configuration of other cell element field areas, may be provided with FILMO structures and the like implemented in hardware or software to ensure proper reconfiguration. The possibility of writing to memory cells while executing instructions, thereby altering the code, i.e., the program to be executed, should be pointed out. In a particularly preferred variant, however, this type of self-modification (SM) is suppressed by appropriate control via the function cell.

It is possible for the memory cell to send the information stored in it directly or indirectly to a bus leading to the function cell in response to the triggering of the function cell controlling it. Indirect output may be accomplished in particular when the two cells are adjacent and the information requested by the triggering must arrive at the ALU-PAE via a bus segment that is not directly connectable to the output of the memory cell. In such a case the memory cell may output data onto this bus system in particular via backward registers. It is therefore preferable if at least one memory cell and/or function cell has such a backward register, which may be situated in the information path between the memory cell and function cell. In such a case, these registers need not necessarily be provided with additional functionalities, although this is readily conceivable, e.g., when data is requested from the memory cell for further processing, corresponding to a traditional LOAD of a typical microprocessor for altering the data even before it is loaded into the PAE, e.g., to implement a LOAD++ command. Data conduction through PAEs having ALUs and the like operating in the reverse direction should be mentioned.

The memory cell is preferably situated to receive information from the function cell controlling it, information saving via an input/output cell and/or a cell that does not control the memory cell also being possible. In particular when data is to be written into the memory cell from an input/output cell, it is preferable if this input/output cell (I/O-PAE) is also controlled by the function cell. The address at which information to be written into the memory cell or, if necessary, to also be transmitted directly to the function cell (PAE) is to be read, may also be transferred to the I/O-PAE from the ALU-PAE. In this connection it should be pointed out that this address may be determined via an address translation table, an address translation buffer or an MMU type structure in the I/O-PAE. In such a case, this yields the full functionalities of typical microprocessors. It should also be pointed out that an I/O functionality may also be integrated with a function cell means, a memory cell means and/or a function cell means-memory cell means combination.

In a preferred variant, at least one input-output means is thus assigned to the combination of function cells and memory cells, whether as an integrated function cell and a memory cell combination or as a function cell and/or memory cell combination composed of separate units, the input/output means being used to transmit information to and/or receive information from an external unit, another function cell, function cell memory cell combination and/or memory cells.

The input-output unit is preferably likewise designed for receiving control commands from the function cell and/or the function cell means.

In a preferred variant, the control connection is designed to transmit some and preferably all of the following commands:

OPCODE FETCH,
DATA WRITE INTERNAL,
DATA WRITE EXTERNAL
DATA READ EXTERNAL,
ADDRESS POINTER WRITE INTERNAL,
ADDRESS POINTER WRITE EXTERNAL,
ADDRESS POINTER READ INTERNAL,
ADDRESS POINTER READ EXTERNAL,
PROGRAM POINTER WRITE INTERNAL,
PROGRAM POINTER WRITE EXTERNAL,
PROGRAM POINTER READ INTERNAL,
PROGRAM POINTER READ EXTERNAL,
STACK POINTER WRITE INTERNAL,
STACK POINTER WRITE EXTERNAL,
STACK POINTER READ INTERNAL,
STACK POINTER READ EXTERNAL,
PUSH,
POP,
PROGRAM POINTER INCREMENT.

This may be accomplished through a corresponding bit width of the control line and an associated decoding at the receivers. The particular required control means and decoding means may be provided inexpensively and with no problems. As it shows, a practically complete sequencer capability of the arrangement is obtained with these commands. It should also be pointed out that a general-purpose processor data processing unit is obtained in this way.

The system is typically selected so that the function cell is the only one able to access the control connection and/or a bus segment, i.e., bus system functioning as the control connection as a master. The result is thus a system in which the control line functions as a command line such as that provided in traditional processors.

The function cell and the memory cell, i.e., I/O cell, are preferably adjacent to one another. The term "adjacent" may be understood preferably as the cells being situated directly side by side. "Directly" means in particular a combination of such cells to form integrated units which are provided repeatedly on the cell element field, i.e., as part of same to form the field. This may mean an integral unit of memory cells and logic cells. Alternatively, they are at least close together. The system of the function cells and memory cells in integrated, i.e., close, proximity to one another thus ensures that there are no latency times, or at least no significant latency times, between triggering and data input of the required information in the function cell, merely because the connections between the cells are too long. This is understood to be "direct." If latency times must be taken into account, pipelining may then also be provided in the sequencer structures. This is particularly important in the case of systems with very high clock rates. It should be pointed out that it is readily possible to provide cell units clocked at a suitably high frequency such as those known in the related art per se which are also able to access suitable memory cells with appropriate speed. In such a case, e.g., when architecture elements that are known per se are used for the function cells, reconfigurability of the function cell element and the corresponding interconnections must be provided. In a particularly preferred variant, the function cells, the information providing cells such as memory cells, I/O cells and the like are arranged multidimensionally, in particular in the manner of a matrix, i.e., on grid points of a multidimensional grid, etc. If there is a regular structure, as is the case there, information, i.e., operands, configurations, trigger signals, etc., is typically supplied to a cell from a first row, while data, trigger signals and other information is dispensed in a row beneath that. In such a case, it is preferable if the cells are situated in one and the same row and the information transfer from the information-providing cell into the required input into the function cell may then take place via a backward register. The possibility of using the registers for pipelining should also be mentioned.

Patent protection is also claimed for a method for operating a cell element field, in particular a multidimensional cell element field having function cells for execution of algebraic and/or logic functions and information-providing cells, in particular memory cells and/or input/output cells for receiving and/or outputting and/or storing information, at least one of the function cells outputting control commands to at least one information-providing cell, information for the function cell being provided there in response to the control commands, and the function cell being designed to perform the additional data processing in response to the information thus provided to thereby process data in the manner of a sequencer at least from time to time.

Sequencer-type data processing is thus made possible in a reconfigurable field by output of the control commands to the memory cell of the sequencer structure. The commands which may be output as control commands by the function cell permit a sequencer type operation such as that known from traditional processors. It should be pointed out that it is readily possible to implement only parts of the aforementioned commands but nevertheless ensure data processing that is completely of the sequencer type.

The present invention is described in greater detail below and as an example on the basis of the drawing, in which.

Figure 1:
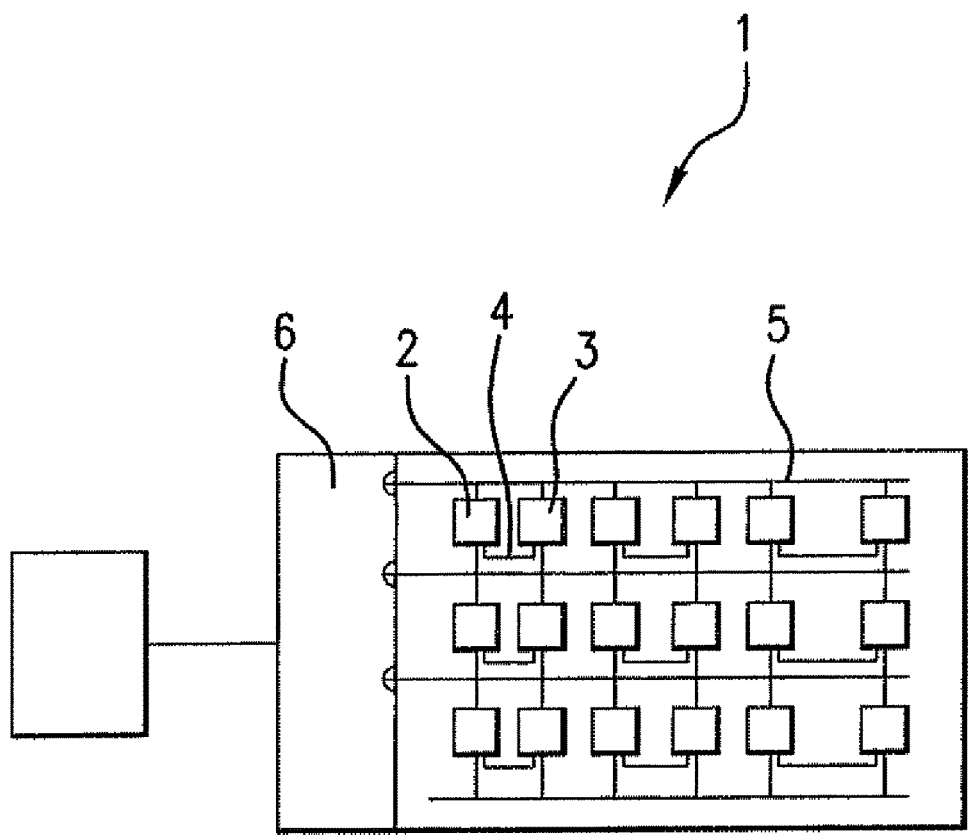
FIG. 1 shows a cell element field according to the present invention.

According to FIG. 1, a cell element field 1 for data processing includes function cell means 2 for execution of arithmetic and/or logic functions and memory cell means 3 for receiving, storing and/or outputting information, a control connection 4 connecting function cells 2 to memory cells 3.

Cell element field 1 is freely configurable in the interconnection of elements 2, 3, 4, namely without interfering with ongoing operation of cell element parts that are not to be reconfigured. The connections may be configured by switching bus systems 5 as necessary. In addition, the particular functions of function cells 2 are configurable. The function cells are arithmetic logic units extended by certain circuits that permit reconfiguration, e.g., state machines, interface circuit for communication with external load logic 6, etc. Reference is made to the corresponding previous applications of the present applicant.

Cell elements 2, 3 of cell element field 1 are arranged two-dimensionally in rows and columns, one memory cell 3 being situated directly next to a function cell 2 with three memory cell-function cell pairs per row, the function cells and memory cells being interconnected by control connections 4. Function cells and memory cells 2, 3, or the combination thereof have inputs which are connected to the bus system above the row in which the particular cell element is located to receive data therefrom. In addition, cells 2, 3 have outputs which output data to bus system 5 below the row. As explained below, each memory cell 3 is also provided with a backward register (BW) through which data from the bus below a row may be guided through to the bus above the particular row.

Memory cell means 3 preferably has at least three memory areas, namely a data area, a program memory area and a stack area, etc. However, in other variants of the present invention it may be adequate provide only two areas, namely a data memory and a program area memory, each optionally forming part of a memory cell means. It is possible in particular to perform not simply a separation of a memory that is identical in terms of hardware and is homogeneous per se into different areas but instead to provide memory areas that are actually separated physically, i.e., in terms of hardware technology. In particular the memory width and/or depth may also be adapted to the particular requirements. When a memory is designed in such a way that it has a program area and a data area in operation, it is preferable to design this memory, i.e., memory area for simultaneous access to data and program memory areas, e.g., as a dual port memory. It may also be possible to provide closely connected memory areas, in particular within a memory cell means-function cell means combination formed into an integrated area as a pure cache memory into which data from remote memory sites is preloaded for rapid access during data processing.

Except for control connections 4 and the particular circuits within the function cells (ALU in FIGS. 2A-2C) and/or memory cells (RAM in FIGS. 2A-2C), the cell element field for data processing in FIG. 1 is a traditional cell element field such as that which is known and conventional with reconfigurable data processing systems, e.g., a VPU according to XPP technology of the present applicant. In particular, the cell element field of FIG. 1 may be operated in the known way, so it has the corresponding circuits for wave reconfiguration, for debugging, transferring trigger signals, etc.

The first distinguishing features of the cell element field of the present invention are derived from control connection 4 and the corresponding circuit, which are described in greater detail below with reference to FIGS. 2A through 2C. It should be pointed out that whereas in FIG. 1, a control connection 4 always leads from a function cell element located farther to the left to a memory cell located farther to the right, specifically only and exactly to one such memory cell, it is also plausibly possible to provide a configurable interconnection for the control lines to be able to address either memory cells situated elsewhere and/or more than one memory cell, if necessary, when there is a great memory demand for information to be received, stored and/or output by the memory cells. For reasons of comprehensibility, however, only individual control connections which are provided in a fixed manner are referred to in FIGS. 1 and 2A-2C, which greatly simplifies understanding of the present invention. The control connection is also substitutable if necessary by traditional lines, assuming the proper protocols are available.

Figure 2A:
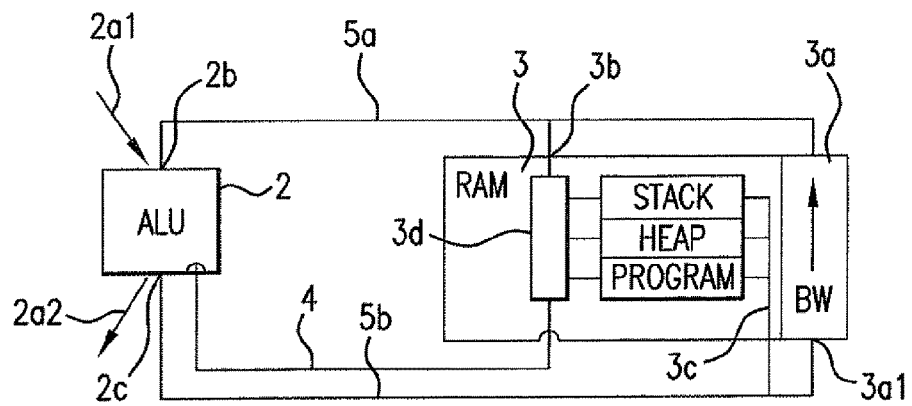
FIG. 2A shows a detail thereof.
Figure 2B:
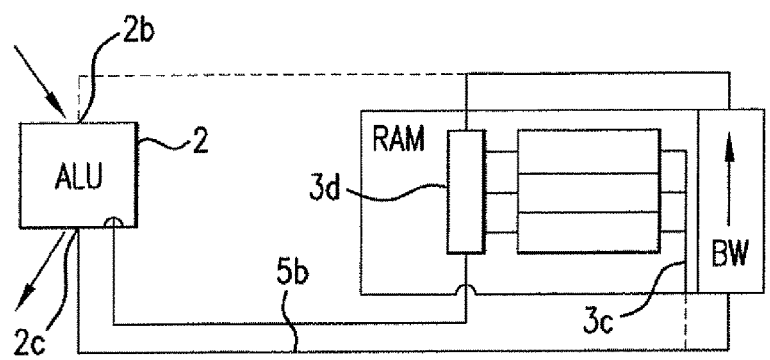
FIGS. 2B, 2C show the detail from FIG. 2A during various data processing times.
Figure 2C:
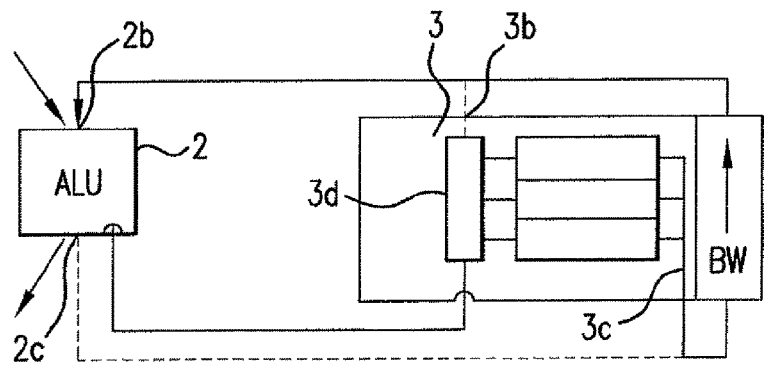

FIGS. 2A-2C show function cell 2 as an ALU and function cell 3 as a RAM. Above the row in which the cells are located runs bus 5a, connecting backward register 3a mentioned above to inputs 3b of the memory cell and 2b of the ALU. The bus system running below the cell is labeled as 5c and only the relevant segments of bus system 5a, 5b are shown here. It is apparent that bus system 5b alternatively receives data from an output 2c of ALU 2, an output 3c of RAM 3 and carries data into input 3a1 of the backward register.

ALU 2 at the same time has additional inputs and outputs 2a1, 2a2 which may be connected to other bus segments and over which the ALU receives data such as operands and outputs results.

Control connection 4 is permanently under control of the extended circuits of the ALU and represents here a connection over which a plurality of bits may be transferred. The width of control connection 4 is selected so that at least the following control commands may be transmitted to the memory cell: DATA WRITE, DATA READ, ADDRESS POINTER WRITE, ADDRESS POINTER READ, PROGRAM POINTER WRITE, PROGRAM POINTER READ, PROGRAM POINTER INCREMENT, STACK POINTER WRITE, STACK POINTER READ, PUSH, POP. Memory cell 3 at the same time has at least three memory areas, namely a stack area, a heap area and a program area. Each area is assigned its own pointer via which it is determined to which area of the stack, the heap and the program area there will be read or write access in each case.

Bus 5a is used jointly by units 2 and 3 in time multiplex. This is indicated in FIGS. 2B, 2C. FIG. 2B illustrates a situation in which data may be sent from output 2a2 of ALU-PAE to the input of the RAM cell via the backward register, whereas the concurrently existing but unused connection between output 3c of the RAM to bus 5b and the connection between the output of backward register BW to input 2b of the ALU-PAE at the point in time of FIG. 2B is of no importance, which is why this is indicated with dashed lines. In contrast, FIG. 2C shows a point in time at which memory cell 3 supplies information via its output 3c and the backward register to input 2b of ALU-PAE 2 from the stack, heap or program memory area via control line 4, while the output of ALU-PAE 2c is inactive and no signal is received at input 3b of the RAM-PAE. For this reason, the corresponding connections are indicated with dash-dot lines and are thus depicted as being inactive.

Within RAM cell 3, a circuit 3d is provided in which the information received via control line 4 and/or control line bus segment 4 is decoded.

The present invention is used as follows:

First, ALU 2 receives configuration information from a central load logic, as is already known in the related art. The transfer of information may take place in a manner known per se using the RDY/ACK protocol and the like. Reference is made to the possibility of providing a FILMO memory, etc., with the load logic to permit a proper configuration of the system.

Simultaneously with the data for configuring ALU 2, a series of data is transmitted from the load logic, representing a program, i.e., program part to be executed in the manner of a sequencer. Reference is made in this regard only as an example to FIG. 6A in which the HUFFMANN coding is depicted as a central sequential part of an MPEG4 coding which is performed in the manner of data flow per se. The ALU therefore outputs a corresponding command to line 4 during its configuration, this command setting the program pointer for writing at a preselected value within the RAM. The load logic then supplies data received by the ALU over output 2c and via bus 5b 1 and backward register 3a, the data going from there to input 3b of RAM-PAE 3. According to the control command on control line 4, data is then written from unit 3d to the program memory location indicated. This is repeated until all the program parts received by the load logic in configuration have been stored in memory cell 3. When the configuration of the ALU is then concluded, the ALU will request the next program steps to be executed by it in the manner of a sequencer by outputting the corresponding commands on control line 4 and will receive the program steps via output 3c, bus 5b, the backward register of RAM-PAE 3 and bus 5a at its input. During program execution, situations may occur in which jumps are necessary within the program memory area, data must be loaded into the ALU-PAE from the RAM-PAE, data must be stored in the stack, etc. The communication in this regard between the ALU-PAE and RAM-PAE is accomplished via control line 4 so that the ALU-PAE is able to execute decoding at any point in time. Moreover, as in a traditional microprocessor, data from a stack or another RAM memory area may be received and in addition, data may also be received in the ALU-PAE from the outside as operands.

The program sequence preconfigured in the RAM-PAE by the load logic is executed here. At the same time, command decoding is performed in the ALU-PAE as is necessary per se. This is done with the same circuits per se as those used already for decoding the commands received by the load logic.

At any point in time control line 4 is controlled via the ALU so that the RAM cell always exactly follows the type of memory access specified by the ALU. This ensures that regardless of the time multiplex use of bus elements 5a, b the elements present in the sequencer structure are instructed at all times whether addresses for data or codes to be retrieved or to be written is on the buses or whether and if so where data is to be written, etc.

The system shown with respect to FIG. 2A-2C may be extended or modified in different ways. The variants depicted in FIGS. 3, 4 and 6A-6B are particularly relevant.

Figure 3:
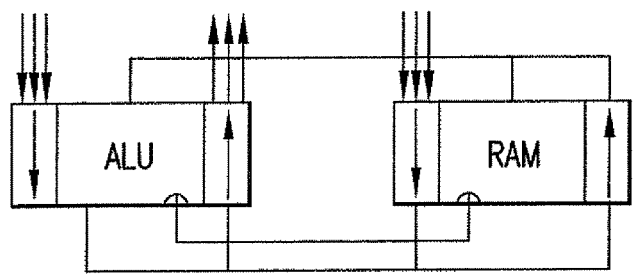
FIG. 3 shows an alternative embodiment of the detail from FIGS. 2A-2C.

According to FIG. 3, not only a backward register is provided on the RAM-PAE for connecting upper buses and lower buses, but also a forward register is provided on the RAM-PAE and forward and backward registers are provided on the ALU-PAE. As indicated by the multiple arrows, these may receive data from other units such as external hosts, external peripherals such as hard drives, main memories and the like and/or from other sequencer structures, PAEs, RAM-PAEs, etc., and send data to them. When an appropriate request command for new program parts from the sequencer structure formed by the ALU-PAE and the RAM-PAE is sent out, it is possible to process program blocks in the sequencer structure which are much larger than those storable in the RAM-PAE. This is an enormous advantage in particular in complex data processing tasks, jumps over wide areas, in particular in subprograms, etc.

Figure 4:
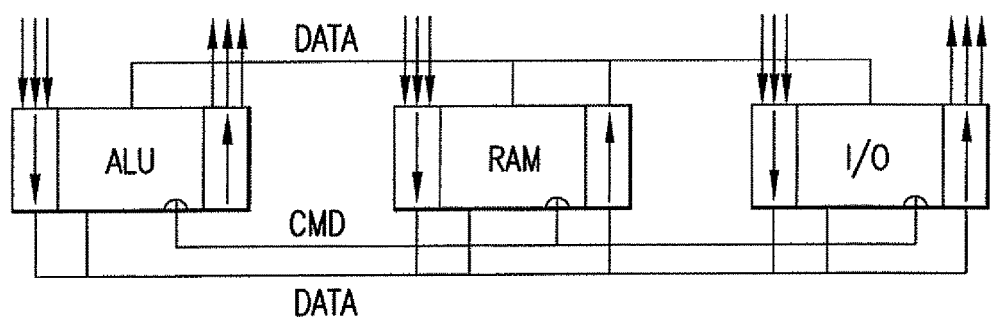
FIG. 4 shows a particularly preferred variant of the detail.

FIG. 4 shows an even more preferred variant where the ALU-PAE communicates not only with a RAM-PAE but also at the same time with an input/output PAE which is designed to provide an interface circuit for communication with external components such as hard drives, other XPP-VPUs, external processors and coprocessors, etc. The ALU-PAE is in turn the unit which operates as the master for the control connection referred to as "CMD" and the buses are in turn used in multiplex mode. Here again, data may be transferred from the bus below the row to the bus above the row through the backward register.

The system shown in FIG. 4 permits particularly easy external access to information stored in the RAM-PAE memory cell and thus allows an adaptation of the sequencer structure to existing traditional CPU technologies and their operating methods to an even greater extent inasmuch as address translation means, memory management units (MMU functions) and the like may be implemented in the input-output cell. The RAM-PAE may function here as a cache, for example, but in particular as a preloaded cache.

It should be pointed out that multiple sequencer structures may be configured into one and the same field at the same time; that function cells, memory cells and, if necessary, input-output cells may optionally be configured for sequencer structures and/or in a traditional manner for XPP technology and that it is readily possible for one ALU to output data to another ALU, which configures it as a sequencer and/or makes it part of a cell element field with which a certain configuration is executed. In this way, the load logic may then also become dispensable, if necessary.

Figure 6A:
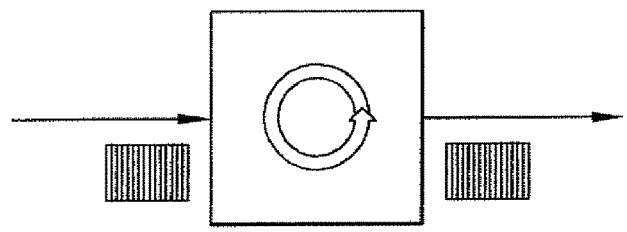
FIG. 6A shows an example of sequential parallel data processing
Figure 6B:
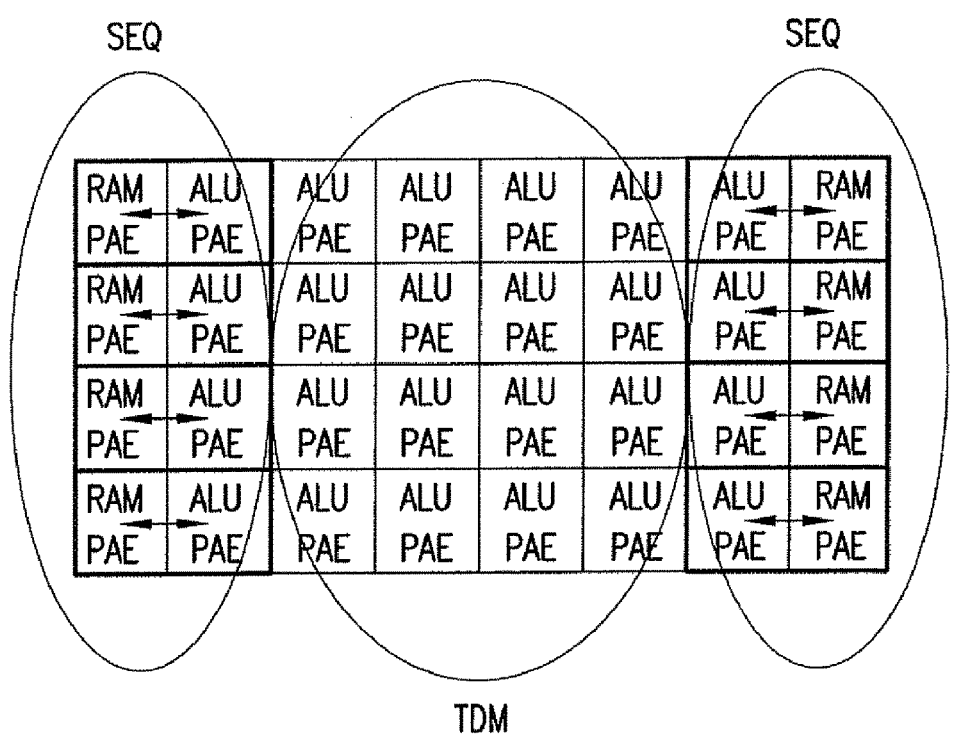
FIG. 6B shows a particularly preferred exemplary embodiment of the present invention

According to FIG. 6A-6B, two embodiments of the present invention are combined in one and the same cell element field, namely at the edges of sequencers formed by two PAEs, namely by one RAM-PAE and one ALU-PAE, and in the interior sequencers formed by integrated RAM-ALU-PAEs as integrated function cell-memory cell units, where it is possible to form only part of the cells inside the field as combination cells.

Figure 5:
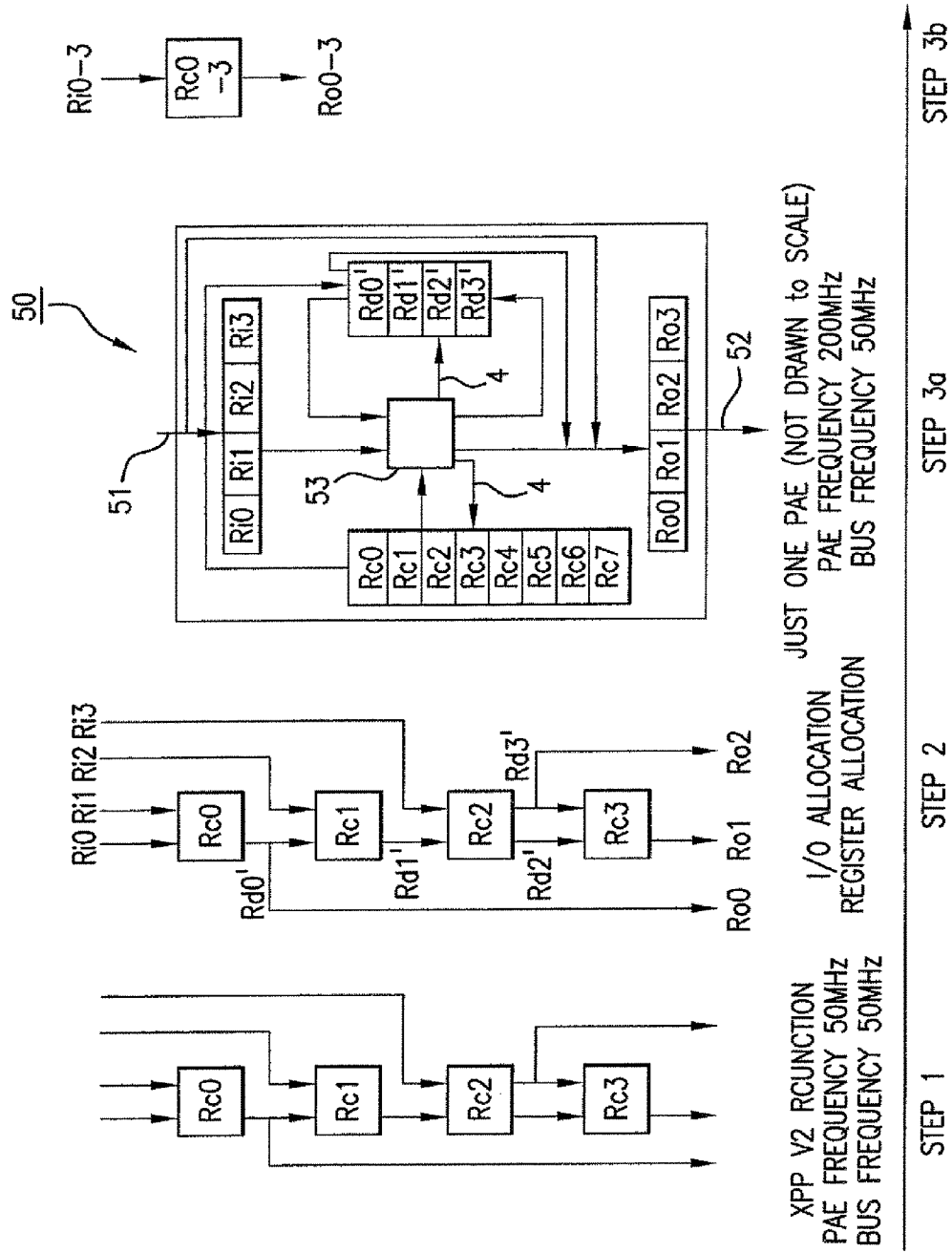
FIG. 5 shows an example of the function folding onto a function cell-memory cell combination according to the present invention.

FIG. 5 shows at the right, STEP 3b, a function cell-memory cell means combination.

According to STEP 3b, a function cell-memory cell means combination labeled as 50 in general includes bus connections, i.e., bus inputs 51 for the input of operand data and configuration data and, as is preferably also possible here in particular, trigger signals (not shown) and the like and a bus output 52 for output of corresponding data and/or signals.

Within the function cell means-memory cell means combination, an ALU 53 is provided as well as input registers Ri0 through Ri3 for operand data and trigger signal input registers (not shown). Configuration data registers Rc0 through Rc7 for configuration data, i.e., ALU code data, result data registers Rd0'-R3' and output registers Ro0 through Ro3 for results, i.e., trigger signals to be output. Registers Re and Rd for the configuration data, i.e., opcode data, are triggered by ALU 53 via control command lines 4 and supply data over suitable data lines to the ALU and/or receive result data from it. It is also possible to supply information directly from bus 51 and/or input registers Ri directly to the output registers, i.e., bus 52, exactly as information may be supplied from data registers Rd0-Rd3 not only to the ALU, but also to the output registers. If necessary, connections may be provided between memory areas Rd and Rc, e.g., for implementation of the possibility of self-modifying codes.

Configuration data area Rc0 through Rc7 has a control unit which makes it possible to work in parts of the area, in particular in repeated cycles and/or through jumps. For example, in a first partial configuration, commands in Rc0 through Rc3 may be executed repeatedly, and alternatively configuration commands in Rc4 through Rc7 may be executed, e.g., on receipt of an appropriate different trigger signal over bus line 51. This ensures executability of a wave configuration. It should be pointed out that the configuration commands input are typically only instructions to the ALU but do not define complete bus connections, etc.

The unit described above, illustrated in FIG. 5, is designed here to be operated with a quadruple clock pulse, like a normal PAE without memory cell means and/or control signal lines 4.

To process data sequencer-style in a data flow in the function folding unit designed in this way, data flow graphs and/or areas according to STEP 1 and STEP 2 are created at first for preselected algorithms. Memory areas Rc0 are then assigned to each operation to be executed in the graph; incoming data into the graph partial area is assigned to internal input registers Ri0; the interim results are assigned to memories Rd0 through Rd3 and the output results are assigned to registers Ro. With this assignment, the graph area is executable on the function folding unit. This results more or less in a data flow-sequencer transformation by this hardware.

It should be mentioned in this context that it will be preferable in general to use the system of the present invention in such a way that first a data flow graph and a control flow graph are created for a data processing program using a compiler and then a corresponding partitioning is performed; the pieces obtained by the partitioning may then be executed partially or entirely on sequencer units such as those which may be formed according to the present invention, for example. This more or less achieves data processing in the manner of data flow progressing from one cell to the next, but effects a sequential execution within the cell(s). This is advantageous when the clock frequency is to be increased because of the extremely high computation power of a system to be able to reduce the area and/or number of cells. It should also be pointed out that it is possible to perform this transformation like transition from a purely data flow type of data processing to data flow processing with local sequential parts in such a way that an iterative process is carried out, e.g., in such a manner that first a first partitioning is performed, and if it is then found in the subsequent "rolling up" of the partitioned parts on sequencer units that the resources available on the sequencers or at other sites, for example, are not sufficient, another partitioning taking this into account may be performed and a new "rolling up" may be performed. If extensive use of the function folding units is desired, the number of registers may be increased, if necessary.

It should also be pointed out that the registers in this case may be interpreted as memory cell means or parts thereof. It is apparent that by increasing the memory cell areas, more complex tasks may be arranged in particular in a sequencer fashion but significant parts of important algorithms may be executed with the small sizes indicated and this may be done with high efficiency.

In the present example, the function folding units are preferably formed in such a way that data may be shifted through them without being processed in the ALU. This may be utilized to achieve path balancing in which data packets must be executed via different branches and then recombined without having to use forward registers such as those known from the architecture of the present applicant. At the same time and/or alternatively, it is possible for the direction of data flow not to run strictly in one direction in the cell element field through an appropriate orientation of a few function cell means, memory cell means, or function folding units but instead to have the data flow run in two opposite directions. Thus, for example, in each even row the ALUs receive their input operands from the left side and in each uneven row the ALUs receive their input operands from the right.

If data must be sent repeatedly through the field, such an arrangement is advantageous, e.g., in the case of unrolled looped bodies, etc. The alternating arrangement need not be strict. For certain applications, other geometries may be selected. For example, a different direction of flow may be selected for the middle of the field than at the edges, etc. The arrangement of function cell units of the same direction of flow side by side may be advantageous with respect to the bus connections. It should be pointed out that the arrangement in opposite directions of multiple directional function cells in one field and the resulting improved data processing independently of providing a control line or the like are regarded as inventive.

Figure 7:
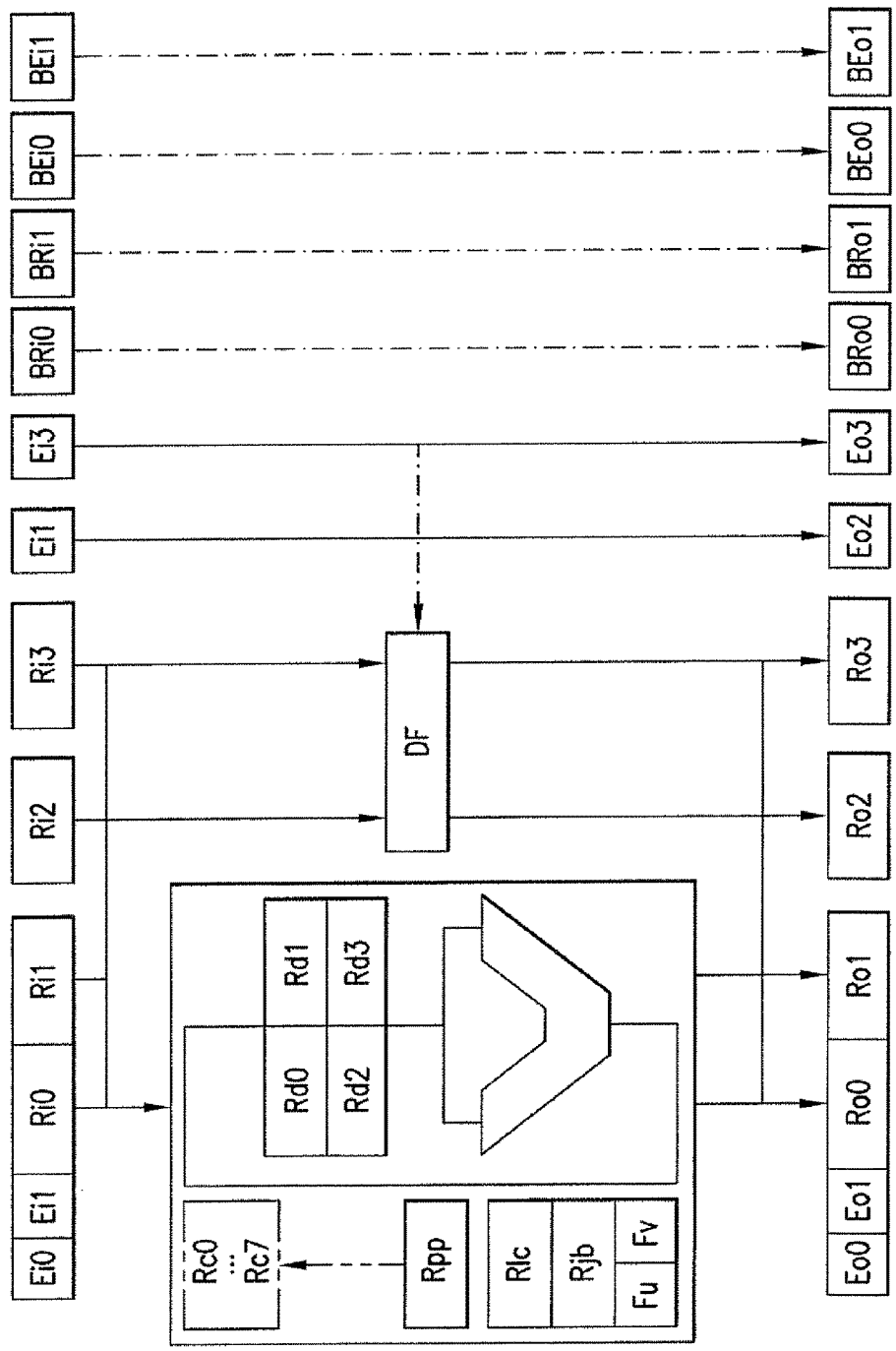
FIG. 7 shows an alternative to a function folding unit.

FIG. 7 shows an alternative to the function folding unit shown in FIG. 5.

The invention claimed is:

1. A multi-processor, comprising:
    a plurality of data processors, each data processor comprising:
        an arithmetic logic unit having an ALU data output and an ALU data input;
        an instruction decoder; and
        a local random access memory (RAM) having a RAM data output and a RAM data input; wherein
            the ALU data output is connected to the RAM data input; and further wherein
            the RAM data output is connected to the ALU data input;
    a plurality of edge memories; and
    a bus system selectively interconnecting the plurality of data processors and the plurality of edge memories.

2. The multi-processor according to claim 1, further comprising at least one input-output (I/O) processor, wherein the bus system selectively interconnects at least one of said plurality of data processor units, at least one of said plurality of edge memories, and at least one of said I/O processor.

3. The multi-processor according to claim 1, wherein one or more of said data processors are connected to at least two clock sources having different clock frequencies.

4. The multi-processor according to claim 1, further including an instruction loader, the instruction loader to transmit a program part, comprising one or more ALU instructions, to the local memories of said plurality of data processors.

5. The multi-processor according to claim 1, further including a Memory Management Unit (MMU).

6. The multi-processor according to claim 2, wherein the input-output (I/O) unit is configured as a Memory Management Unit (MMU).

7. The multi-processor according to claim 1, wherein the bus system further selectively interconnects processors with each other.

* * * * *